US006225389B1

(12) United States Patent
Saint Victor

(10) Patent No.: US 6,225,389 B1
(45) Date of Patent: May 1, 2001

(54) SCREEN COATING COMPOSITION AND METHOD FOR APPLYING SAME

(75) Inventor: Marie-Esther Saint Victor, Blue Bell, PA (US)

(73) Assignee: Henkel Corp., Gulph Mills, PA (US)

( * ) Notice: Subject to any disclaimer, the term of this patent is extended or adjusted under 35 U.S.C. 154(b) by 0 days.

(21) Appl. No.: 09/376,784

(22) Filed: Aug. 18, 1999

Related U.S. Application Data

(63) Continuation-in-part of application No. 09/137,000, filed on Aug. 20, 1998, now Pat. No. 6,156,816.

(51) Int. Cl.$^7$ .................................................. C08K 5/20
(52) U.S. Cl. ..................... 524/224; 524/223; 524/387; 524/388; 524/728; 524/765
(58) Field of Search ...................................... 524/224, 223, 524/387, 388, 728, 765

(56) References Cited

U.S. PATENT DOCUMENTS

| | | | |
|---|---|---|---|
| 1,985,424 | 12/1934 | Piggott | 260/124 |
| 2,569,502 | 10/1951 | Swern et al. | 260/348 |
| 2,965,576 | 12/1960 | Wilson | 252/137 |
| 4,205,018 | 5/1980 | Nagasawa et al. | 525/404 |
| 4,216,287 | 8/1980 | Sano et al. . | |
| 4,271,258 | 6/1981 | Watariguchi . | |
| 4,362,808 | 12/1982 | Otthofer, Jr. . | |
| 4,391,898 | 7/1983 | van der Velden . | |
| 4,404,075 | 9/1983 | Ikeda et al. . | |
| 4,652,492 | 3/1987 | Seiner et al. | 428/414 |
| 5,013,631 | 5/1991 | Su | 430/271 |
| 5,110,889 | 5/1992 | Higbie et al. | 526/320 |
| 5,194,639 | 3/1993 | Connor et al. | 554/66 |
| 5,266,690 | 11/1993 | McCurry, Jr. et al.. | 536/18.6 |
| 5,278,009 | 1/1994 | Iida et al. . | |
| 5,334,764 | 8/1994 | Scheibel et al. | 564/487 |
| 5,340,681 | 8/1994 | Sypek et al. . | |
| 5,449,763 | 9/1995 | Wulff et al. | 536/18.6 |
| 5,514,727 | 5/1996 | Green et al. . | |
| 5,637,380 | 6/1997 | Kaneko et al. . | |
| 5,688,633 | 11/1997 | Leach . | |
| 5,880,171 | 3/1999 | Lim et al. | 523/106 |
| 5,889,076 | * 3/1999 | Dones et al. | 522/143 |
| 5,916,669 | * 6/1999 | Parker et al. | 428/216 |

OTHER PUBLICATIONS

*Radiation Curing of Polymeric Materials*, ACS Symposium Series 417, Charles E. Hoyle, Editor and James F. Kinstle, Editor, American Chemical Society, Washington, D.C., 1990, pp. 1–16.
*Printing–Ink Vehicles*, Encyclopedia of Polymer Science and Engineering, vol. 13, pp. 368–398 (1988).
*Photopolymerization of Surface Coatings*, C.G. Roffey, John Wiley & Sons, pp. 209–243.

\* cited by examiner

*Primary Examiner*—Margaret G. Moore
(74) *Attorney, Agent, or Firm*—John E. Drach; Steven J. Trzaska

(57) ABSTRACT

A substantially water-free, water-washable, energy-curable composition includes an epoxy oligomer and/or urethane oligomer having at least two ethylenically unsaturated moieties, at least one alkoxylated polyol monomer having at least two ethylenically unsaturated moieties and capable of being copolymerized with the oligomer, and a sugar surfactant capable of rendering the uncured composition dispersible in water. Optionally, the composition can contain a photoinitiator. The composition is self-dispersible in water and is especially suitable for use as a coating material for a printing screen.

85 Claims, No Drawings

SCREEN COATING COMPOSITION AND METHOD FOR APPLYING SAME

CROSS-REFERENCE TO RELATED APPLICATIONS

This application is a continuation-in-part of application Ser. No. 09/137,000 filed on Aug. 20, 1998, the entire contents of which are incorporated herein by reference, now U.S. Pat. No. 6,156,816.

BACKGROUND OF THE INVENTION

1. Field of the Invention

The present invention relates to a water-free, water-washable, energy-curable, polymer-forming composition, especially useful as a print screen coating, and a method for applying same.

2. Background of the Art

In silk screen printing, the ink is forced onto a printing substrate through a stencil, or "mask", having a porous screen area configured in the shape of the indicia to be printed, such as letters or graphic images. The printing substrate can be paper, textile, metal, ceramic, polymer film, and the like. The screen can be a gauze or mesh fabricated from metal, textile fabric such as silk or cotton, or various polymer materials.

The mask is generally prepared by coating a screen with a curable composition, curing the composition, and then engraving the indicia. The engraved areas are porous, thereby permitting ink to be forced through the screen onto the printing substrate to print the indicia.

After printing, the ink on the substrate is cured or hardened by any of several methods such as, for example, exposure of the ink to energy such as heat or radiation (e.g. ultraviolet, electron beam, and the like), evaporation of a solvent in the ink composition, or oxidation hardening of drying oil components (e.g. linseed oil, tung oil), and the like.

The three main technologies being practiced today which make up the bulk of the coatings and inks include solvent borne, water borne, and zero volatile organic compounds (VOC). Solvent borne and water borne systems produce coatings which are washable. Water washability is a desired feature of a coating composition since the coating application equipment needs to be cleaned for reuse. However, there has been a technological push to eliminate organic solvents and water in such compositions. Organic solvents present environmental health concerns. And both solvent based and water based systems are energy intensive, requiring drying ovens to remove the solvent or water. For example, thermally induced drying and curing of coated screen fabric typically requires about 7,000 to 12,000 kilojoules of energy per kilogram of fabric as well as a long curing time, typically several hours. Consequently, what is desired is a waterless, yet water-dispersible, zero VOC composition which would be particularly useful as a coating for a print screen.

SUMMARY OF THE INVENTION

In accordance with the present invention, a substantially water-free, water-washable, energy-curable, polymer-forming composition is provided which comprises:

a) an oligomer selected from the group consisting of epoxy oligomer and urethane oligomer, said oligomer having at least two polymerizable ethylenically unsaturated moieties;

b) at least one alkoxylated polyol monomer having at least two polymerizable ethylenically unsaturated moieties and capable of being copolymerized with oligomer component (a) to provide a solid cured polymer when exposed to energy-polymerizing conditions; and, c) at least one surface active agent capable of being integrated into the molecular structure of the polymer resulting from the copolymerization of (a) and (b) either by covalent bonding or by hydrogen bonding, and further capable of rendering said composition water-dispersible.

Also provided herein is a method for coating a screen with the aforementioned composition employing applicator means which can be washed with water.

The foregoing composition contains substantially no VOCs and is readily dispersible in water. Another advantage of this composition is that it significantly reduces the amount of energy and time required to effect curing.

DETAILED DESCRIPTION OF THE PREFERRED EMBODIMENTS

While the present invention is particularly applicable to coatings for print screens, it should be understood that any coating application or substrate, for printing or non-printing purposes, is within its scope. Percentages of materials are by weight unless stated otherwise. Note that all quantities appearing hereinafter shall be understood to be modified by the term "about" except in the Examples and unless indicated otherwise.

The substantially water-free, water-washable, energy-curable, poly-forming composition herein includes an epoxy oligomer and/or urethane oligomer having at least two polymerizable ethylenically unsaturated moieties, an alkoxylated polyol monomer having at least two ethylenically unsaturated moieties and a surface active agent which is copolymerizable with the oligomer and/or monomer.

An aliphatic and/or aromatic urethane oligomer may optionally be employed instead of, or in addition to, the epoxy oligomer. The urethane oligomer component is preferably a urethane acrylate such as, for example, PHOTOMER® 6008 available from Henkel Corporation. However, the epoxy oligomer is preferred.

Also, the epoxy oligomer may optionally be accompanied by polyester acrylate oligomer, trimethylol propane dimer-ester tetraacrylate oligomer, or dipolyoxypropylene glycerol adipate oligomer.

Generally, the energy-curable composition of the present invention includes the following component weight percentages:

| | |
|---|---|
| Oligomers | 30%–70% |
| Monomers | 30%–70% |
| Surfactants | 0.1% to about 20% |
| Photoinitiators | 0–10% |

The epoxy oligomer can be prepared by reacting an epoxide with an unsaturated acid such as acrylic or methacrylic acid, optionally in the presence of a polyamide derived from a polymerized fatty acid.

In one embodiment the epoxy acrylate oligomer is derived from a compound having the formula:

$$R^1\text{—}[\text{—}CH_2\text{—}CHOH\text{—}CH_2\text{—}O(O)C\text{—}CH\text{=}CH_2]_n$$

wherein $R^1$ is an aliphatic, aromatic or arene moiety having at least two carbon atoms and at least two oxido residues, and n is an integer of from 2 to 6.

Useful epoxides include the glycidyl ethers of both polyhydric phenols and polyhydric alcohols, epoxidized fatty acids or drying oil acids, epoxidized diolefins, epoxidized di-unsaturated acid esters, as well as epoxidized unsaturated polyesters, preferably containing an average of more than one epoxide group per molecule. The preferred epoxy compounds will have a molecular weight of from 300 to 600 and an epoxy equivalent weight of between 150 and 1,200.

Representative examples of the epoxides include condensation products of polyphenols and (methyl) epichlorohydrin. For the polyphenols, there may be listed bisphenol A, 2,2'-bis(4-hydroxyphenyl)methane (bisphenol F), halogenated bisphenol A, resorcinol, hydroquinone, catechol, tetrahydroxyphenylethane, phenol novolac, cresol novolac, bisphenol A novolac and bisphenol F novolac. There may also be listed epoxy compounds of the alcohol ether type obtainable from polyols such as alkylene glycols and polyalkylene glycols, e.g. ethylene glycol, 1,2-propylene glycol, 1,3-propylene glycol, 1,4-butanediol, 1,6-hexanediol, neopentyl glycol, glycerine, diglycerol, trimethylolpropane, pentaerythritol, inositol, sorbitol, polyethylene glycol, polypropylene glycol, polytetrahydrofuran, (i.e., poly(1,4-butanediol), which is obtainable under the designation TERATHONE® from DuPont), and alkylene oxide-adduct of bisphenols, and (methyl)epichlorohydrin; glycidyl amines obtainable from anilines such as diaminodiphenylmethane, diaminophenylsulfone and p-aminophenol, and (methyl)epichlorohydrin; glycidyl esters based on acid anhydrides such as phthalic anhydride and tetrahydro- or hexahydro-phthalic anhydride; and alicyclic epoxides such as 3,4-epoxy-6-methylcyclohexylmethyl and 3,4-epoxy-6-methylcyclohexyl carboxylate.

Glycidyl polyethers of polyhydric phenols are made from the reaction of a polyhydric phenol with epihalohydrin or glycerol dihalohydrin, and a sufficient amount of caustic alkali to combine with the halogen of the halohydrin. Glycidyl ethers of polyhydric alcohols are made by reacting at least about 2 moles of an epihalohydrin with 1 mole of a polyhydric alcohol such as ethylene glycol, pentaerythritol, etc., followed by dehydrohalogenation.

In addition to polyepoxides made from alcohols or phenols and an epihalohydrin, polyepoxides made by the known peracid methods are also suitable. Epoxides of unsaturated esters, polyesters, diolefins and the like can be prepared by reacting the unsaturated compound with a peracid. Preparation of polyepoxides by the peracid method is described in various periodicals and patents and such compounds as butadiene, ethyl linoleate, as well as di- or tri-unsaturated drying oils or drying oil acids, esters and polyesters can all be converted to polyepoxides. Epoxidized drying oils are also well known, these polyepoxides usually being prepared by reaction of a peracid such as peracetic acid or performic acid with the unsaturated drying oil according to U.S. Pat. No. 2,569,502.

In certain embodiments, the diepoxide is an epoxidized triglycerides containing unsaturated fatty acids. The epoxidized triglyceride may be produced by epoxidation of one or more triglycerides of vegetable or animal origin. The only requirement is that a substantial percentage of diepoxide compounds should be present. The starting materials may also contain saturated components. However, epoxides of fatty acid glycerol esters having an iodine value of 50 to 150 and preferably 85 to 115 are normally used. For example, epoxidized triglycerides containing 2% to 10% by weight of epoxide oxygen are suitable. This epoxide oxygen content can be established by using triglycerides with a relatively low iodine value as the starting material and thoroughly epoxidizing them or by using triglycerides with a high iodine value as starting material and only partly reacting them to epoxides. Products such as these can be produced from the following fats and oils (listed according to the ranking of their starting iodine value): beef tallow, palm oil, lard, castor oil, peanut oil, rapeseed oil and, preferably, cottonseed oil, soybean oil, train oil, sunflower oil, linseed oil. Examples of typical epoxidized oils are epoxidized soybean oil with an epoxide value of 5.8 to 6.5, epoxidized sunflower oil with an epoxide value of 5.6 to 6.6, epoxidized linseed oil with an epoxide value of 8.2 to 8.6 and epoxidized train oil with an epoxide value of 6.3 to 6.7.

Further examples of polyepoxides include the diglycidyl ether of diethylene glycol or dipropylene glycol, the diglycidyl ether of polypropylene glycols having molecular weight up to, for example, 2,000, the triglycidyl ether of glycerine, the diglycidyl ether of resorcinol, the diglycidyl ether of 4,4'-isopropylidene diphenol, epoxy novolacs, such as the condensation product of 4,4'-methylenediphenol and epichlorohydrin and the condensation of 4,4'-isopropylidenediphenol and epichlorohydrin, glycidyl ethers of cashew nut oil, epoxidized soybean oil, epoxidized unsaturated polyesters, vinyl cyclohexene dioxide, dicyclopentadiene dioxide, dipentene dioxide, epoxidized polybutadiene and epoxidized aldehyde condensates such as 3,4-epoxycyclohexyl methyl-3',4'-epoxycyclohexane carboxylate.

Particularly preferred epoxides are the glycidyl ethers of bisphenols, a class of compounds which are constituted by a pair of phenolic groups interlinked through an intervening aliphatic bridge. While any of the bisphenols may be used, the compound 2,2-bis(p-hydroxyphenyl) propane, commonly known as bisphenol A, is more widely available in commerce and is preferred. While polyglycidyl ethers can be used, diglycidyl ethers are preferred. Especially preferred are the liquid Bisphenol A-epichlorohydrin condensates with a molecular weight in the range of from 300 to 600.

The acid component is comprised of an ethylenically unsaturated acid. Particularly suitable ethylenically unsaturated monocarboxylic acid are the alpha, beta-unsaturated monobasic acids. Examples of such monocarboxylic acid monomers include acrylic acid, beta-acryloxypropionic acid, methacrylic acid, crotonic acid, and alpha-chloroacrylic acid. Preferred examples are acrylic acid and methacrylic acid. Also suitable acid components are adducts of hydroxyalkyl acrylates or hydroxyalkyl methacrylates and the anhydrides of dicarboxylic acids such as, for example, phthalic anhydride, succinic anhydride, maleic anhydride, glutaric anhydride, octenylsuccinic anhydride, dodecenylsuccinic anhydride, chlorendic anhydride, tetrahydrophthalic anhydride, hexahydrophthalic anhydride and methyltetrahydrophthalic anhydride. Such adducts can be prepared by methods of preparative organic chemistry known in the art. The acid component can also contain other carboxylic acids. In certain embodiments, the acid component will be comprised of a minor amount, e.g. less than 50% of the total acid equivalents, more typically less than 20% of the total acid equivalents, of a fatty acid. The fatty acids are saturated and/or unsaturated aliphatic monocarboxylic acids containing 8 to 24 carbon atoms or saturated or unsaturated hydroxycarboxylic acids containing 8 to 24 carbon atoms. The carboxylic acids and/or hydroxycarboxylic acids may be of natural and/or synthetic origin. Examples of suitable monocarboxylic acids are caprylic acid, 2-ethylhexanoic acid, capric acid, lauric acid, myristic acid, palmitic acid, palargonic acid, palmitoleic acid, stearic acid, isostearic acid, oleic acid, elaidic acid, petroselic acid, linoleic acid, linolenic acid, elaeostearic acid, conjuene fatty acid, ricinoleic acid, arachic acid, gadoleic acid, behenic acid, erucic acid and brassidic acid and the technical mixtures thereof obtained, for example, in the pressure hydrolysis of natural fats and oils, in the oxidation of aldehydes from Roelen's oxo synthesis, or as monomer fraction in the dimerization of unsaturated fatty acids. In a particularly preferred embodiment, the fatty acid is derived from technical mixtures of the fatty acids mentioned which are obtainable in the form of the technical mixtures typically encountered in oleochemistry after the pressure hydrolysis of oils and fats of animal or vegetable origin, such as coconut oil, palm kernel oil, sunflower oil, rape oil, rapeseed oil and coriander oil and beef tallow. However, the fatty acid may also contain a branched fatty acid residue, for example the residue of 2-ethyl hexanoic acid, isopalmitic acid or isostearic acid.

Preferred fatty acids are mixtures obtained from natural sources, e.g. palm oil, palm kernel oil, coconut oil, rapeseed oil (from old high-erucic acid plants or from new low-erucic acid plants, a.k.a. canola oil), sunflower oil (from old low-oleic plants or from new high-oleic plants), castor oil, soybean oil, cottonseed oil, peanut oil, olive oil, olive kernel oil, coriander oil, castor oil, meadowfoam oil, chaulmoogra oil, tea seed oil, linseed oil, beef tallow, lard, fish oil and the like. Naturally occurring fatty acids typically are present as triglycerides of mixtures of fatty acids wherein all fatty acids have an even number of carbon atoms and a major portion by weight of the acids have from 12 to 18 carbon atoms and are saturated or mono-, di-, or tri-unsaturated.

The preferred epoxy resins, i.e., those made from bisphenol A, will have two epoxy groups per molecule. Thus, the product of a reaction with acrylic or methacrylic acid will contain an epoxy (meth)acrylate compound having a main chain of polyepoxide and both terminals of a (meth)acrylate group, respectively. Accordingly, the stoichiometric amount of acrylic acid to form a diacrylate adduct would be two moles of acid for each two epoxy groups. In practice, however, it is preferred to use an amount of acid slightly in excess of the amount necessary to cover both epoxy groups. Therefore, the amount of acrylic acid reacted is typically between 2.001 moles to 2.1 moles, and more typically between 2.01 and 2.05 moles of acid per two epoxy groups.

Alternatively, the reaction of the epoxide and the acid can take place in the presence of a polyamide derived from a polymerized fatty acid. The polyamide preferably has a number average molecular weight of less than 10,000 grams/mole. Low melting polyamide resins melting within the approximate range of 90° C. to 130° C. may be prepared from polymeric fatty acids and aliphatic polyamines. Typical of the polyamines which may be used are ethylene diamine, diethylene triamine, triethylene tetramine, tetraethylene pentamine, 1,4-diaminobutane, 1,3-diaminobutane, hexamethylene diamine, piperazine, isophorone diamine, 3-(N-isopropylamine)-propylamine, 3,3'-iminobispropylamine, and the like. A preferred group of these low melting polyamides are derived from polymeric fatty acids, and ethylene diamine and are solid at room temperature.

Suitable such polyamides are commercially available under the trade designation of VERSAMID® polyamide resins, e.g. VERSAMID® 335, 750 and 744, and are amber-colored resins having a number average molecular weight up to 10,000, preferably from 1,000 to 4,000 and a softening point from below room temperature to 190° C.

The preferred polyamide is VERSAMID® 335 polyamide which is commercially available from Henkel Corporation and has an amine value of 3, a number average molecular weight of 1699, as determined by gel permeation chromatography (GPC) using a polystyrene standard, and a polydispersity of 1.90.

The preparation of such VERSAMID® polyamide resins is well known and by varying the acid and/or functionality of the polyamine, a great variety of viscosities, molecular weights and levels of active amino groups spaced along the resin molecule can be obtained. Typically, the VERSAMID® polyamide resins useful herein have amine values from 0 to 25, preferably 0 to 10, more preferably 0 to 5; viscosities of from about 1 to 30 poises (at 160° C.) and polydispersities of less than 5. The amine value and number average molecular weight of the polyamide can be determined as described in U.S. Pat. No. 4,652,492 (Seiner et. al.), the disclosure of which is incorporated herein by reference.

The polyamide is incorporated into the composition in an amount not exceeding 50% by weight based on the combined weight of the epoxide and acid components and the polyamide. Preferably, an amount not exceeding 25% by weight is utilized and most preferred is an amount of from 5% to 15% by weight.

The reaction between the epoxide and acid can be performed over a wide range of temperatures, e.g. from 40° C. to 150° C., more typically from 50° C. to 130° C. and preferably between 90° C. and 110° C., at atmospheric, sub-atmospheric or superatmospheric pressure; preferably in an inert atmosphere. Esterification is continued until an acid number of 2 to 15 is obtained. This reaction ordinarily takes place in 8 to 15 hours. To prevent premature or undesirable polymerization of the product or the reactants, it is advantageous to add a vinyl inhibitor to the reaction mixture. Suitable vinyl polymerization inhibitors include tert-butylcatechol, hydroquinone, 2,5-ditertiarybutylhydroquinone, hydroquinonemonoethyl ether, etc. Advantageously, the inhibitor is included in the reaction mixture at a concentration of 0.005 to 0.1% by weight based on the total of the reagents.

The reaction between the epoxide and the acid proceeds slowly when uncatalyzed, and can be accelerated by suitable catalysts which preferably are used, such as, for example, the tertiary bases such as triethyl amine, tributylamine, pyridine, dimethylaniline, tris (dimethylaminomethyl)-phenol, triphenyl phosphine, tributyl phosphine, tributylstilbine; alcoholates such as sodium methylate, sodium butylate, sodium methoxyglycolate, etc.; quaternary compounds such as tetramethylammonium bromide, tetramethylammonium chloride, benzyl-trimethylammonium chloride, and the like. At least 0.01 percent, based on total weight of reagents, preferably at least 0.1 percent, of such catalyst is desirable.

Typical examples of suitable monomers which can be used and added to the reaction mixture before or during the reaction, or added after the reaction, as a reactive diluent, are the vinyl or vinylidene monomers containing ethylenic unsaturation, and which can copolymerized with the compositions of this invention are, styrene, vinyl toluene, tertiary butyl styrene, alpha-methyl-styrene, monochlorostyrene, dichlorostyrene, divinylbenzene, ethyl vinyl benzene, diisopropenyl benzene, methyl acrylate, ethyl acrylate, methyl methacrylate, ethyl methacrylate, acrylonitrile, methacrylonitrile, the vinyl esters, such as vinyl acetate and the monovinyl esters of saturated and unsaturated aliphatic, monobasic and polybasic acids, such as the vinyl esters of the following acids: propionic, isobutyric, caproic, oleic, stearic, acrylic, methacrylic, crotonic, succinic, maleic, fumaric, itaconic hexahydrobenzoic, citric, tartaric, etc., as well as the corresponding allyl, methallyl, etc., esters of the aforementioned acids, the itaconic acid monoesters and diesters, such as the methyl, ethyl, butyl esters, etc.; the maleic and fumaric acid monoesters, diesters and their amide and nitrile compounds, such as diethyl maleate, maleyl tetramethyl diamide, fumaryl dinitrile, dimethyl fumarate; cyanuric acid derivatives having at least one copolymerizable unsaturated group attached directly or indirectly to the triazine ring such as diallyl ethyl cyanurate, triallyl cyanurate, etc., ethers such as vinyl allyl ether, divinyl ether, diallyl ether, resorcinol divinyl ether, etc., diallyl chlorendate, diallyl tetrachloro phthalate, diallyl tetrabromophthalate, dibromopropargyl acrylate, as well as the partial fusible or soluble polymerizable polymers of the hereinabove listed monomers, etc.

In preparing the polymerizable compositions containing the reaction product of this invention and one or more of the monomers of the type listed hereinabove, the relative amount of the monomers can vary broadly. In general, however, the monomer or monomers are used at less than 50% by weight of the composition, typically in the range of about 1% to 30% by weight, and more typically in the range of 5% to 15% by weight.

Epoxy oligomers prepared by reacting an epoxide with acrylic acid in the presence of a polyamide derived from a polymerized fatty acid possess the advantage of being thixotropic. The viscosity of compositions containing such oligomers decreases with the application of increasing agitation or shear stress and gradually returns to its former viscous state when allowed to rest. Thus, the composition exhibits lower viscosity when in the process of being applied to a substrate under the application of force or pressure. However, once the coating has been applied it resumes its high viscosity state and tends to remain on the substrate without running.

Also, epoxy oligomer may optionally be accompanied by polyester acrylate oligomer, trimethylol propane dimerester tetraacrylate oligomer, or dipolyoxypropylene glycerol adipate oligomer.

Referring now to the alkoxylated polyol component of the composition described herein, the preferred alkoxylated polyol monomer has the formula.

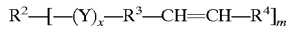
$$R^2\mathrm{-\!\!\!-\!\!\![-(Y)}_x\mathrm{-\!R^3\!-\!CH\!=\!CH\!-\!R^4]}_m$$

wherein $R^2$ is an aliphatic, aromatic or arene moiety having at least two carbon atoms and at least two oxido residues, Y is an alkylene oxide moiety and x is an integer of from 2 to 6, $R^3$ is a linkage group capable of joining the alkylene oxide moiety Y and the —CH=CH— group, $R^4$ is hydrogen or —C(O)OR$^5$ wherein $R^5$ is hydrogen or an alkyl group of from 1 to 22 carbon atoms, and m is an integer of from 2 to 6.

More particularly, $R^2$ can be an ethylene glycol residue, propylene glycol residue, trimethylol propane residue, pentaerythritol residue, neopentyl glycol residue, glyceryl residue, diglyceryl residue, inositol residue, sorbitol residue, hydroquinone residue, catechol residue, or bisphenol residue (e.g bisphenol A). $R^2$ can also be selected from saturated or unsaturated straight or branched chain aliphatic moieties of from 6 to 24 carbon atoms such as epoxidized soy bean oil residue. Alternatively, $R^2$ can be polyethylene glycol, or ethylene oxide/propylene oxide copolymer.

Y is preferably an ethylene oxide or propylene oxide residue.

$R^3$ can optionally be, for example, the linking groups —O—, —O(O)C—, —OCH$_2$CH$_2$—, or —OCH$_2$CHOHCH$_2$O(O)C—.

The alkoxylated polyol monomer component preferably comprises a mixture of at least one alkoxylated polyol diacrylate such as, for example, bisphenol A ethoxylate diacrylate and/or neopentyl glycol propoxylate diacrylate, and at least one alkoxylated polyol triacrylate such as, for example trimethylolpropane ethoxylate triacrylate.

A preferred composition includes 10% to 15% by weight of neopentyl glycol propoxylate diacrylate, 5% to 10% bisphenol A ethoxylate diacrylate, and 15% to 20% trimethylolpropane ethoxylate triacrylate based on total composition weight. Preferably, also, the epoxy oligomer component used in conjunction with the alkoxylated polyol monomer component is obtained by reacting a diepoxide such as a diglycidyl ether of a dihydric phenol (e.g. bisphenol A) with an unsaturated acid component (e.g. acrylic acid) in the presence of a polyamide derived from a fatty acid.

Referring now to the surface active agent component, photopolymerizable print screen coating pastes are water insoluble, hence the need for a surface active agent capable of providing water-dispersibility so that the uncured coating paste can be washed off the application equipment. It is most efficient to include the surface active agent as part of the screen printing ink composition rather than as a component in the wash water. The surface active agents described herein are capable of being integrated into the molecular structure of the cured polymer resulting from the copolymerizable of the oligomer and the alkoxylated polyol monomer components. Integration of the surface active agent into the molecular structure of the cured polymer can be accomplished by, e.g., covalent bonding. For example, the surface active agent can include one or more active sites capable of establishing covalent bonds, such as, for example, unsaturated sites or reactive groups. Alternatively, the surface active agent can be integrated into the molecular structure of the cured polymer by means of hydrogen bonds. In either case the surface active agent possesses the advantage of not migrating within the cured coating. Moreover, integration of the surface active agent prevents water sensitivity of the cured polymer coating which would be caused by the presence of free surfactant.

One type of surface active agent found to be suitable for use in the composition of the present invention includes ethylene oxide/propylene oxide block copolymers. Such copolymers are available from BASF Corporation under the designations PLURONIC™ P105, PLURONIC™ F108, PLURONIC™ F104, and PLURONIC™ L44, for example, and have the following formula:

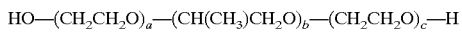
$$\mathrm{HO-(CH_2CH_2O)}_a\mathrm{-(CH(CH_3)CH_2O)}_b\mathrm{-(CH_2CH_2O)}_c\mathrm{-H}$$

wherein b is at least 15 and $(CH_2CH_2O)_{a+c}$ is varied from 20%–90% by weight.

Another type of surface active agent suitable for use in the composition of the present invention includes ethoxylated acetylenic alcohols and diols such as those available under the designations SURFYNOL® 465 and SURFYNOL® 485(W) from Air Products Co. A preferred surface active agent includes an acetylenic glycol decene diol.

Yet another type of surface active agent suitable for use in the present invention includes fluoropolymers and prepolymers such as, for example, fluorinated alkyl esters such as 2-N(alkyl perfluorooctane sulfonamido) ethyl acrylate which is available under designation FLUORAD FC-430 from 3M Co.

Yet another type of surface active agent suitable for use in the present invention includes epoxy silicones such as SILQUEST A-187 available from OSi Specialties, Inc., of Danbury, Conn., which has the formula:

$$\mathrm{H_2C\!-\!\!-\!\!CHCH_2OCH_2Si(OCH_3)_3}$$

Yet another type of surface active agent suitable for use in the present invention is a sugar surfactant such as an alkyl polyglycoside and/or a polyhydroxy fatty acid amide. Examples of suitable polyhydroxy fatty acid amides include those corresponding to formula I:

 (I)

wherein $R_1$ is H, $C_1$–$C_4$ hydrocarbyl, 2-hydroxy ethyl, 2-hydroxy propyl, or a mixture thereof, preferably $C_1$–$C_4$ alkyl, more preferably $C_1$ or $C_2$ alkyl, most preferably $C_1$ alkyl (i.e., methyl); and $R_2$ is a $C_5$–$C_{31}$ hydrocarbyl moiety, preferably straight chain $C_7$–$C_{19}$ alkyl or alkenyl, more preferably straight chain $C_9$–$C_{17}$ alkyl or alkenyl, most preferably straight chain $C_{11}$–$C_{19}$ alkyl or alkenyl, or mixture thereof; and Y is a polyhydroxyhydrocarbyl moiety having a linear hydrocarbyl chain with at least 3 hydroxyls directly connected to the chain, or an alkoxylated derivative (preferably ethoxylated or propoxylated) thereof. Y preferably will be derived from a reducing sugar in a reductive amination reaction; more preferably Y is a glycityl moiety. Suitable reducing sugars include glucose, fructose, maltose, lactose, galactose, mannose, and xylose. As raw materials, high dextrose corn syrup, high fructose corn syrup, and high maltose corn syrup can be utilized as well as the individual sugars listed above. These corn syrups may yield a mix of sugar components for Y. It should be understood that it is by no means intended to exclude other suitable raw materials. Y preferably will be selected from the group consisting of —$CH_2$—$(CHOH)_n$—$CH_2OH$, —$CH(CH_2OH)$—$(CHOH)_{n-1}$—$CH_2OH$, —$CH_2$—$(CHOH)_2(CHOR')(CHOH)$—$CH_2OH$, where n is an integer from 3 to 5, inclusive, and R' is H or a cyclic mono- or poly-saccharide, and alkoxylated derivatives thereof. Most preferred are glycityls wherein n is 4, particularly —$CH_2$—$(CHOH)_4$—$CH_2OH$. Compounds of the formula I are also known as glucamides. Therefore, when, for example, $R_1$ is methyl, $R_2$ dodecyl; and Y is —$CH_2$—$(CHOH)_4$—$CH_2OH$, the compound in question is referred to as dodecyl N-methylglucamide.

Methods for making polyhydroxy fatty acid amides are known in the art. In general, polyhydroxy fatty acid amides can be made by reductively aminating a reducing sugar reacting with an alkyl amine to form a corresponding N-alkyl polyhydroxyamine and then reacting the N-alkyl polyhydroxyamine with a fatty aliphatic ester or triglyceride to form the N-alkyl, polyhydroxy fatty acid amide. Processes for making polyhydroxy fatty acid amides are disclosed in U.S. Pat. Nos. 1,985,424; 2,965,576; 5,194,639; and 5,334,764 the entire contents of each of which is incorporated herein by reference.

Examples of suitable alkyl polyglycosides include those corresponding to the formula II:

 II wherein $R_1$ is a monovalent organic radical having from about 6 to about 30 carbon atoms; $R_2$ is divalent alkylene radical having from 2 to 4 carbon atoms; Z is a saccharide residue having 5 or 6 carbon atoms; b is a number having a value from 0 to about 12; a is a number having a value from 1 to about 6. Preferred alkyl polyglycosides which can be used in the compositions according to the invention have the formula I wherein Z is a glucose residue and b is zero. Such alkyl polyglycosides are commercially available, for example, as APG®, GLUCOPON®, PLANTAREN® or AGRIMUL® surfactants from Henkel Corporation, Ambler, Pa., 19002. Examples of such surfactants include but are not limited to:

1. GLUCOPON® 220 Surfactant—an alkyl polyglycoside in which the alkyl group contains 8 to 10 carbon atoms and having an average degree of polymerization of 1.5.
2. GLUCOPON® 225 Surfactant—an alkyl polyglycoside in which the alkyl group contains 8 to 10 carbon atoms and having an average degree of polymerization of 1.7.
3. GLUCOPON® 600 Surfactant—an alkyl polyglycoside in which the alkyl group contains 12 to 16 carbon atoms and having an average degree of polymerization of 1.4.
4. GLUCOPON® 625 Surfactant—an alkyl polyglycoside in which the alkyl group contains 12 to 16 carbon atoms and having an average degree of polymerization of 1.4.
5. APG® 325 Surfactant—an alkyl polyglycoside in which the alkyl group contains 9 to 11 carbon atoms and having an average degree of polymerization of 1.6.
6. PLANTAREN® 2000 Surfactant—an alkyl polyglycoside in which the alkyl group contains 8 to 16 carbon atoms and having an average degree of polymerization of 1.4.
7. PLANTAREN® 1300 Surfactant—an alkyl polyglycoside in which the alkyl group contains 12 to 16 carbon atoms and having an average degree of polymerization of 1.6.
8. AGRIMUL® PG 2067 Surfactant—an alkyl polyglycoside in which the alkyl group contains 8 to 10 carbon atoms and having an average degree of polymerization of 1.7.

Other examples include alkyl polyglycoside surfactant compositions which are comprised of mixtures of compounds of formula I as described in U.S. Pat. Nos. 5,266,690 and 5,449,763, the entire contents of both of which are incorporated herein by reference.

A particularly preferred sugar surfactant for use in the present invention is an alkyl polyglycoside corresponding to formula II wherein $R_1$ is a monovalent organic radical having from about 8 to about 16 carbon atoms, b is zero, and a is a number having a value of from about 1 to about 2.

Generally, the surface active agent preferably constitutes from 0.1% to 20% of the total composition, more preferably 0.5% to 10%, and most preferably from 1% to 5%.

Polymerization of the energy-polymerizable composition of the present invention may be effected by the use of, for example, electron beam (EB) radiation or ultraviolet (UV) radiation. Photoinitiators are not a required component of the composition if EB radiation is used to effect polymerization. However, if UV radiation is employed the composition should include a photoinitiator.

Any photoinitiator suitable for the purposes described herein may be employed. Examples of useful photoinitiators include one or more compounds selected from benzildimethyl ketal, 2,2-diethoxy-1,2-diphenylethanone, 1-hydroxycyclohexyl-phenyl ketone, α,α-dimethoxy-α-hydroxy acetophenone, 1-(4-isopropylphenyl)-2-hydroxy-2-methylpropan-1-one, 1-[4-(2-hydroxyethoxy)phenyl]-2-hydroxy-2-methyl-propan-1-one, 2-methyl-1-[4-(methylthio)phenyl]-2-morpholino-propan-1-one, 2-benzyl-2-N,N-dimethylamino-1-(4-morpholinophenyl)-butan-1-one, 3,6-bis(2-methyl-2-morpholino-propanonyl)-9-butyl-carbazole, 4,4'-bis(dimethylamino)benzophenone, 2-chlorothioxanthone, 4-chlorothioxanthone, 2-isopropylthioxanthone, 4-isopropylthioxanthone, 2,4-dimethylthioxanthone, 2,4-diethylthioxanthone, 4-benzoyl-N,N-dimethyl-N-[2-(1-oxo-2-propenyl)oxy]ethylbenzenemethanaminium chloride, methyldiethanolamine, triethanolamine, ethyl 4-(dimethylamino)benzoate, 2-n-butoxyethyl 4-(dimethylamino)benzoate and combinations thereof.

Benzophenone, which is not per se a photoinitiator, may be used in photoinitiator compositions in conjunction with a coinitiator such as thioxanthone, 2-isopropyl thioxanthone, 4-isopropylthioxanthone, 2-chlorothioxanthone, 4-chlorothioxanthone, and amine coinitiators such as methyldiethanolamine and ethyl 4-(dimethylamino) benzoate.

It is preferable to have a blend of photoinitiators such that the combined absorption spectra of the individual photoinitiators matches the spectral output of the UV lamp (or other radiation emitter) used to effect the curing of the coating or ink composition. For example, mercury vapor lamps have strong emissions in the UV 2400 Å to 2800 Å range and in the UV 3400 Å to 3800 Å range. By choosing a suitable blend of photoinitiators a more efficient utilization of the spectral output of the lamp can be achieved. Such increased efficiency can translate to faster throughput during the energy-polymerization process.

Moreover, coatings employing the composition described herein can include colorants such as pigments and dyes which absorb UV light. For example, pigments generally absorb wavelengths of light below 3700 Å. To cure such a coating one needs to generate free radicals by using a photoinitiator which absorbs light above 3700 Å. A suitable photoinitiator for pigmented systems includes 2-benzyl-2-dimethylamino-1-(4- morpholinophenyl)-butan-1-one, which is commercially available under the designation Irgacure 369 from Ciba-Geigy.

To insure that the composition does not prematurely polymerize, a free radical inhibitor may optionally be added to the polymerizable composition. Examples of suitable inhibitors include hydroquinone and methyl ether thereof or butylated hydroxytoluene at a level of from 5 ppm to 2000 ppm by weight of the polymerizable components. Additives which are particularly useful in prolonging the shelf-life of the composition can also be used, e.g. UV stabilizers such as Fluorstab U.V.-II from Kromachem.

The UV radiation is preferably applied to a film of the present composition at an energy density of from 2,000 to 3,000 mJ/cm$^2$, more preferably 2,200 to 2,500 mJ/cm$^2$, in order to optimize through-curing of the film. While the film can be tack free with exposure to 20–40 mJ/cm$^2$, energy densities less than 2000 mJ/cm$^2$ produce a film with a lower degree of crosslinking (as measured by pendulum hardness testing), and energy densities greater than 3000 exhibit a deleterious effect on the cured film.

The composition described herein may be applied to a screen as a coating in a conventional manner. For example, the composition can be applied by brushes, rollers, spraying or by dipping the screen in the composition. The screen can be a mesh fabricated from, for example, silk, polyester, polypropylene, high density polyethylene, nylon, glass, and metal such as nickel, aluminum, steel, etc. The coating composition is then cured or hardened by exposure to polymerizing radiation such as UV or EB radiation to form a blank stencil.

Generally, a six second exposure time is sufficient to cure the composition into a hard, tack-free coating with an energy requirement of 460 kJ per kg of screen fabric.

After the screen coating is hardened, the blank stencil can be engraved, for example by means of laser light, to create porous areas in the shape of desired indicia. The engraved screen can then be used as a mask in a screen printing process in a conventional manner. The uncured composition remaining on the application equipment is readily washable with water.

The wettability of the composition described herein on a substrate such as nickel can be measured by contact angle goniometry. The present composition exhibits a contact angle on nickel of no more than 100°, more preferably no more than 70°, and most preferably no more than 30°.

The following examples are given for the purpose of illustrating the present invention.

EXAMPLE 1

A composition was made by mixing the following components:

Oligomer Component
  40% of a composition containing an epoxy oligomer obtained by reacting a diglycidyl ether of bisphenol A with acrylic acid in the presence of VERSAMID® 335 polyamide (10%) and propoxylated glycerol triacrylate (15%).
  9% dipolyoxypropylene glycerol adipate oligomer
Monomer Component
  17% trimethylol propane ethoxylate triacrylate (available from Henkel Corp. under the designation PHOTOMER® 4149).
  12.5% neopentyl glycol propoxylate diacrylate (available from Henkel Corp. under the designation PHOTOMER® 4127).
  6% bisphenol A ethoxylate diacrylate (available from Henkel Corp. under the designation PHOTOMER® 4028).
Photoinitiator Component
  0.5% blend of 2-isopropyl thioxanthone and 4-isopropylthioxanthone (available from International Bio-Synthetics under the designation Quantacure ITX).
  2.5% 2-methyl-1-[4-(methylthio)phenyl]-2-morpholinopropan-1-one (available from Ciba-Geigy under the designation Irgacure 907).
Pigment Component
  0.25% Irgalite Yellow.
Surface Active Agent Component
  12% of ethylene oxide/propylene oxide block copolymer (available from BASF under the designation Pluronic F-105.

The above components were mixed in accordance with the following procedure:

First, the epoxy acrylate oligomer, 50% of PHOTOMER® 4028, all of PHOTOMER® 4127, and the pigment were mixed together with grinding to form a ground paste. Next, the rest of the oligomer components were added to the ground paste. The surfactant mixture was prepared by blending the surface active agent with 50% of the PHOTOMER® 4149 under mild heating (less than 35° C.). The surfactant blend was then added at room temperature to the ground paste with stirring. The photoinitiator was mixed with the remaining 50% of the PHOTOMER® 4149 and then added to the ground paste with mixing.

The resulting composition was self-emulsifying, had a viscosity of 2300 centipoise, and exhibited thixotropic shear thinning characteristics.

The composition was applied as a 2 mil thick film to screen substrates of aluminum, nickel, and steel mesh and then cured by passing the substrates under a U.V. lamp under the following conditions:

| Lamp: | Hg vapor |
|---|---|
| Power: | 300 watts/cm |
| Conveyor speed: | 20 ft./min. |
| Exposure time: | 6 seconds |
| Exposure temperature: | 25° C. |

The film was observed to be tack free after one pass. The following tests were performed on the cured film.

Wettability of the metal substrates by the composition was measured using a contact angle goniometer at room temperature. The contact angle of the UV cured epoxy acrylate based film of this Example was found to be 27.5 degrees.

The hardness of the cured film, one indicator of crosslink density, was measured in accordance with ASTM D4366-92 Pendulum damping test. The cured film exhibited a hardness of 157 counts as measured by this test.

The solvent resistance of the cured film was measured by the ASTM D5402-93 MEK double rub test. The cured film was measured at more than 200 double rubs.

Adhesion of the film was assessed by a conventional tape test and by scanning electron microscope. The film exhibited sufficient adhesion.

EXAMPLE 2

A composition was made by mixing the following components:
Oligomer Component
  37.3% of a composition containing epoxy oligomer obtained by reacting a diglycidyl ether of bisphenol A with acrylic acid in the presence of VERSAMID® 335 polyamide (10%) and propoxylated glyceryl triacrylate (15%).
Monomer Component
  18.66% trimethylol propane ethoxylate triacrylate (PHOTOMER® 4149).
  9.33% neopentyl glycol propoxylate diacrylate (PHOTOMER® 4127).
  13.99% bisphenol-A-ethoxylate diacrylate (PHOTOMER® 4028).
Photoinitiator Component
  9.52% blend of Quantacure 369 (available from International Bio Synthetics and Darocur 4265 (available from Merck).
Pigment Component
  1.87% Irgalite yellow.
Surface Active Agent Component
  9.33% Ethylene oxide/propylene oxide copolymer (Pluronic 105 available from BASF).

The composition of this Example was prepared in accordance with the mixing method of Example 1. The composition was water washable. It had a viscosity of 3500 centipoise and exhibited thixotropic shear thinning characteristics.

The composition was applied to a nickel screen substrate and then cured by passing the substrate under a UV lamp under the same conditions as set forth in Example 1.

The sample was observed to be tack free after one pass. The contact angle measured by a goniometer as an indicator of wettability was 27.5.

EXAMPLE 3

A composition was made by mixing the following components:
Oligomer Component
  40% of a composition containing epoxy oligomer obtained by reacting a diglycidyl ether of bisphenol A with acrylic acid in the presence of VERSAMID® 335 polyamide (10%) and propoxylated glyceryl triacrylate (15%).
  9% dipolyoxypropylene glycerol adipate oligomer.
Monomer Component
  17% trimethylol propane ethoxylate triacrylate (PHOTOMER® 4149).
  13% neopentyl glycol propoxylate diacrylate (PHOTOMER® 4127.
  6% bisphenol-A-ethoxylate diacrylate (PHOTOMER® 4028).
Photoinitiator Component
  3% 2-benzyl-2-N,N-dimethylamino-1-(4-morpholinophenyl)-1-butanone available as Irgacure 369.
  1% thioxanthone
Pigment Component
  1% Phthalo Blue GS
Surface Active Agent Component
  10% Ethylene oxide/propylene oxide copolymer (Pluronic 108 available from BASF).

The composition of this Example was prepared in accordance with the mixing method of Example 1. The composition was water washable and exhibited thixotropic shear thinning characteristics.

EXAMPLE 4

A composition was made by mixing the following components:
Oligomer Component
  25% of a composition containing epoxy oligomer obtained by reacting a diglycidyl ether of bisphenol A with acrylic acid in the presence of VERSAMID® 335 polyamide (10%) and propoxylated glyceryl triacrylate (15%).
Monomer Component
  27.25% trimethylol propane ethoxylate triacrylate (PHOTOMER® 4149).
  8% neopentyl glycol propoxylate diacrylate (PHOTOMER® 4127).
  30% bisphenol-A-ethoxylate diacrylate (PHOTOMER® 4028).
Photoinitiator Component
  2.5% Irgacure 369
  0.94% thioxanthone
Pigment Component
  0.31% Phthalo Blue GS
Surface Active Agent Component
  6% Ethylene oxide/propylene oxide copolymer (Pluronic 108 available from BASF).

The composition of this Example was prepared in accordance with the mixing method of Example 1. The composition was water washable and exhibited thixotropic shear thinning characteristics.

While the above description contains many specifics, these specifics should not be construed as limitations on the scope of the invention, but merely as exemplifications of preferred embodiments thereof. Those skilled in the art will envision many other possible variations that are within the scope and spirit of the invention as defined by the claims appended hereto.

What is claimed is:

1. A substantially water-free, water-washable, energy-curable, polymer-forming composition which comprises:
   a) an oligomer selected from the group consisting of epoxy oligomer and urethane oligomer, said oligomer having at least two ethylenically unsaturated moieties;
   b) at least one alkoxylated polyol monomer having at least two ethylenically unsaturated moieties and capable of being copolymerized with oligomer component (a) to provide a solid cured polymer when exposed to energy-polymerizing conditions; and,
   c) a sugar surfactant selected from the group consisting of a polyhydroxy fatty acid amide, an alkyl polyglycoside, and mixtures thereof.

2. The composition of claim 1 wherein the epoxy oligomer is an epoxy acrylate oligomer.

3. The composition of claim 2 wherein the epoxy acrylate oligomer is derived from an oligomer having the formula:

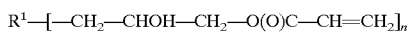

wherein $R^1$ is an aliphatic, aromatic or arene moiety having at least two carbon atoms and at least two oxido residues, and n is an integer of from 2 to about 6.

4. The composition of claim 3 wherein $R^1$ is a bisphenol residue.

5. The composition of claim 3 wherein $R^1$ is selected from the group consisting of hydroquinone residue and catechol residue.

6. The composition of claim 3 wherein $R^1$ includes a straight or branched chain alkyl group of from 2 to about 6 carbon atoms.

7. The composition of claim 6 wherein $R^1$ is selected from the group consisting of ethylene glycol residue, propylene glycol residue, trimethylolpropane residue, pentaerythritol residue, neopentyl glycol residue, glyceryl residue, diglyceryl residue, inositol residue, and sorbitol residue.

8. The composition of claim 3 wherein $R^1$ is a saturated or unsaturated, straight or branched chain aliphatic moiety of from about 6 to about 24 carbon atoms.

9. The composition of claim 8 wherein $R^1$ is an epoxidized soy bean oil residue.

10. The composition of claim 3 wherein $R^1$ is a polyethylene glycol moiety.

11. The composition of claim 3 wherein $R^1$ is an ethylene oxide-propylene oxide copolymer.

12. The composition of claim 1 wherein the epoxy oligomer is thixotropic.

13. The composition of claim 1 wherein the epoxy oligomer is obtained by reacting a diepoxide with an acid component having an ethylenically unsaturated carboxylic acid or reactive derivative thereof in the presence of a polyamide derived from a polymerized fatty acid.

14. The composition of claim 13 wherein the acid component is acrylic acid.

15. The composition of claim 14 wherein the diepoxide is a diglycidyl ether of a dihydric phenol.

16. The composition of claim 1 wherein the alkoxylated polyol monomer has the formula:

$$R^2-[-(Y)_x-R^3-CH=CH-R^4]_n$$

wherein $R^2$ is an aliphatic, aromatic, or arene moiety having at least two carbon atoms and at least two oxido residues, Y is an alkylene oxide moiety and x is an integer of from 2 to about 6, $R^3$ is a linkage group which joins the alkylene oxide moiety Y and the —CH=CH— group, $R^4$ is hydrogen or —C(O)OR$^5$ wherein $R^5$ is hydrogen or an alkyl group having from 1 to about 22 carbon atoms, and n is an integer of from 2 to about 6.

17. The composition of claim 16 wherein $R^2$ is a bisphenol residue.

18. The composition of claim 16 wherein $R^2$ is selected from the group consisting of hydroquinone residue and catechol residue.

19. The composition of claim 16 wherein $R^2$ includes a straight or branched chain alkyl group of from 2 to about 6 carbon atoms.

20. The composition of claim 16 wherein $R^2$ is selected from the group consisting of ethylene glycol residue, propylene glycol residue, trimethylolpropane residue, pentaerythritol residue, neopentyl glycol residue, glyceryl residue, diglyceryl residue, inositol residue, and sorbitol residue.

21. The composition of claim 16 wherein $R^2$ is a saturated or unsaturated, straight or branched chain aliphatic moiety of from about 6 to about 24 carbon atoms.

22. The composition of claim 16 wherein $R^2$ is an epoxidized soy bean oil residue.

23. The composition of claim 16 wherein $R^2$ is a polyethylene glycol moiety.

24. The composition of claim 16 wherein $R^2$ is an ethylene oxide-propylene oxide copolymer.

25. The composition of claim 16 wherein Y is an ethylene oxide residue.

26. The composition of claim 16 wherein $R^3$ is a member selected from the group consisting of —O—, —O(O)C—, —OCH$_2$CH$_2$— and —OCH$_2$CHOHCH$_2$O(O)C—.

27. The composition of claim 16 wherein the at least one alkoxylated polyol monomer comprises a mixture of at least one alkoxylated polyol diacrylate and at least one alkoxylated polyol triacrylate.

28. The composition of claim 27 wherein said composition exhibits a contact angle on nickel of no more than about 100°.

29. The composition of claim 27 wherein said composition exhibits a contact angle on nickel of no more than about 70°.

30. The composition of claim 27 wherein said composition exhibits a contact angle on nickel of no more than about 30°.

31. The composition of claim 27 wherein the composition includes from about 5% to about 30% of the at least one alkoxylated polyol diacrylate and from about 5% to about 30% of the at least one alkoxylated polyol triacrylate based on total composition weight.

32. The composition of claim 2 wherein the composition includes from about 10% to about 25% of at least one alkoxylated polyol diacrylate and from about 10% to about 25% by weight of at least one alkoxylated polyol triacrylate based on total composition weight.

33. The composition of claim 27 wherein the composition includes from about 15% to about 20% of the at least one alkoxylated polyol diacrylate and from about 15% to 20% of the at least one alkoxylated triacrylate based on total composition weight.

34. The composition of claim 27 wherein the at least one alkoxylated polyol triacrylate is trimethylolpropane ethoxylate triacrylate and the at least one alkoxylated polyol diacrylate is a member selected from the group consisting of bisphenol A ethoxylate diacrylate, neopentyl glycol propoxylate diacrylate and mixtures thereof.

35. The composition of claim 34 wherein the epoxy oligomer is derived from bisphenol A epoxy diacrylate.

36. The composition of claim 34 wherein the monomer mixture includes from about 10% to about 15% by weight of neopentyl glycol propoxylate diacrylate, and from about 15% to about 20% by weight of trimethylolpropane ethoxylate triacrylate, based on total composition weight.

37. The composition of claim 36 wherein the monomer mixture further includes from about 5% to about 10% bisphenol A ethoxylate diacrylate, based on total composition weight.

38. The composition of claim 36 wherein the epoxy oligomer is obtained by reacting a diepoxide with an acid component having an ethylenically unsaturated carboxylic acid or reactive derivative thereof in the presence of a polyamide derived from a polymerized fatty acid.

39. The composition of claim 38 wherein the acid component is acrylic acid.

40. The composition of claim 39 wherein the diepoxide is a diglycidyl ether of a dihydric phenol.

41. The composition of claim 1 wherein the sugar surfactant is a polyhydroxy fatty acid amide corresponding to formula I:

$$R_2-\overset{\overset{O}{\|}}{C}-\overset{\overset{R_1}{|}}{N}-Y \qquad (I)$$

wherein $R_1$ is H, $C_1$–$C_4$ hydrocarbyl, 2-hydroxy ethyl, 2-hydroxy propyl, or a mixture thereof; and $R_2$ is a $C_5$–$C_{31}$ hydrocarbyl moiety; and Y is a polyhydroxyhydrocarbyl moiety having a linear hydrocarbyl chain with at least 3 hydroxyls directly connected to the chain, or an alkoxylated derivative thereof.

42. The composition of claim 1 wherein the sugar surfactant is an alkyl polyglycoside corresponding to formula II:

$$R_1O(R_2O)_b(Z)_a \qquad II$$

wherein $R^1$ is a monovalent organic radical having from about 6 to about 30 carbon atoms; $R_2$ is divalent alkylene radical having from 2 to 4 carbon atoms; Z is a saccharide residue having 5 or 6 carbon atoms; b is a number having a value from 0 to about 12; a is a number having a value from 1 to about 6.

43. The composition of claim 42 wherein in formula II, $R_1$ is a monovalent organic radical having from about 8 to about 16 carbon atoms, b is zero, and a is a number having a value of from about 1 to about 2.

44. The composition of claim 1 further including a photoinitiator.

45. The composition of claim 44 wherein the photoinitiator is at least one member selected from the group consisting of benzildimethyl ketal, 2,2-diethoxy-1,2-diphenylethanone, 1-hydroxy-cyclohexyl-phenyl ketone, α,α-dimethoxy-α-hydroxy acetophenone, 1-(4-isopropylphenyl)-2-hydroxy-2-methyl-propan-1-one, 1-[4-(2-hydroxyethoxy)phenyl]-2-hydroxy-2-methyl-propan-1-one, 2-methyl-1-[4-(methylthio)phenyl]-2-morpholino-propan-1-one, 2-benzyl-2-N,N-dimethylamino-1-(4-morpholinophenyl)-butan-1-one, 3,6-bis(2-methyl-2-morpholino-propanonyl)-9-butyl-carbazole, 4,4'-bis (dimethylamino)benzophenone, 2-chlorothioxanthone, 4-chlorothioxanthone, 2-isopropylthioxanthone, 4-isopropylthioxanthone, 2,4-dimethylthioxanthone, 2,4-diethylthioxanthone, 4-benzoyl-N,N-dimethyl-N-[2-(1-oxo-2-propenyl)oxy]ethylbenzenemethanammonium chloride, methyldiethanolamine, triethanolamine, ethyl 4-(dimethylamino)benzoate, 2-n-butoxyethyl 4-(dimethylamino)benzoate and combinations thereof.

46. The composition of claim 1 further including a colorant.

47. The composition of claim 46 wherein the colorant is a blue pigment and the composition further includes a 2-benzyl-2-N,N-dimethylamino-1-(4-morpholinophenyl)-1-butanone and thioxanthone.

48. The composition of claim 1 wherein the urethane oligomer is at least one member selected from the group consisting of aliphatic urethane acrylate oligomer and aromatic urethane acrylate oligomer.

49. A photopolymerized resin obtained by the energy polymerization of the composition of claim 1.

50. A screen coated with a coating material comprising:
a) an oligomer selected from the group consisting of epoxy oligomer and urethane oligomer, said oligomer having at least two ethylenically unsaturated moieties;
b) at least one alkoxylated polyol monomer having at least two ethylenically unsaturated moieties and capable of being copolymerized with oligomer component (a) to provide a solid cured polymer when exposed to energy-polymerizing conditions; and,
c) a sugar surfactant selected from the group consisting of a polyhydroxy fatty acid amide, an alkyl polyglycoside, and mixtures thereof.

51. The screen of claim 50 wherein said screen is fabricated from a material selected from the group consisting of silk, polyester, polypropylene, high density polyethylene, nylon, glass, nickel, aluminum and steel.

52. The screen of claim 50 wherein the coating material further comprises a photoinitiator.

53. The screen of claim 50 wherein the epoxy oligomer is an epoxy acrylate oligomer derived from an oligomer having the formula:

$$R^1\text{---}[\text{---}CH_2\text{---}CHOH\text{---}CH_2\text{---}O(O)C\text{---}CH_2\text{=}CH_2]_n$$

wherein $R^1$ is an aliphatic, aromatic or arene moiety having at least two carbon atoms and at least two oxido residues and n is an integer of from 2 to about 6.

54. The screen of claim 50 wherein the epoxy oligomer is obtained by reacting a diepoxide with an acid component having an ethylenically unsaturated carboxylic acid or reactive derivative thereof in the presence of a polyamide derived from a polymerized fatty acid.

55. The screen of claim 50 wherein the alkoxylated polyol monomer has the formula:

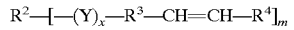

wherein $R^2$ is an aliphatic, aromatic or arene moiety having at least two carbon atoms and at least two oxido residues, Y is an alkylene oxide moiety and x is an integer of from 2 to 6, $R^3$ is a linkage group which joins the alkylene oxide moiety Y and the —CH=CH— group, $R^4$ is hydrogen or —C(O)OR$^5$ wherein $R^5$ is hydrogen or an alkyl group of from 1 to 22 carbon atoms, and m is an integer of from 2 to 6.

56. The screen of claim 55 wherein $R^2$ is selected from the group consisting of bisphenol residue, ethylene glycol residue, propylene glycol residue, trimethylolpropane residue, pentaerythritol residue, neopentyl glycol residue, glyceryl residue, diglyceryl residue, inositol residue, and sorbitol residue.

57. The screen of claim 50 wherein said coating material is cured.

58. The screen of claim 57 wherein the screen is engraved with indicia.

59. The screen of claim 50 wherein the sugar surfactant is a polyhydroxy fatty acid amide corresponding to formula I:

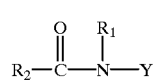

wherein $R_1$ is H, $C_1$–$C_4$ hydrocarbyl, 2-hydroxy ethyl, 2-hydroxy propyl, or a mixture thereof; and $R_2$ is a $C_5$–$C_{31}$ hydrocarbyl moiety; and Y is a polyhydroxyhydrocarbyl moiety having a linear hydrocarbyl chain with at least 3 hydroxyls directly connected to the chain, or an alkoxylated derivative thereof.

60. The screen of claim 50 wherein the sugar surfactant is an alkyl polyglycoside corresponding to formula II:

wherein $R_1$ is a monovalent organic radical having from about 6 to about 30 carbon atoms; $R_2$ is divalent alkylene radical having from 2 to 4 carbon atoms; Z is a saccharide residue having 5 or 6 carbon atoms; b is a number having a value from 0 to about 12; a is a number having a value from 1 to about 6.

61. The screen of claim 60 wherein in formula II, $R_1$ is a monovalent organic radical having from about 8 to about 16 carbon atoms, b is zero, and a is a number having a value of from about 1 to about 2.

62. In a method for coating a substrate in which an energy-curable polymer-forming composition is applied by applicator means to a substrate and the polymer forming composition is thereafter exposed to a source of energy under such conditions as to form a coating of cured polymer on the substrate, an improvement comprising
a) employing the applicator means for applying a substantially water-free, water-washable, energy-curable, polymer-forming composition which comprises
i. an epoxy oligomer having at least two ethylenically unsaturated moieties,
ii. at least one alkoxylated polyol monomer having at least two ethylenically unsaturated moieties and capable of being copolymerized with epoxy oligomer (a) to provide a solid polymer when exposed to energy-curing conditions, and iii. a sugar surfactant selected from the group consisting of a polyhydroxy fatty acid amide, an alkyl polyglycoside, and mixtures thereof, and b) washing the applicator means with water to remove excess polymer-forming composition therefrom.

63. The method of claim 62 wherein the epoxy oligomer is an epoxy acrylate oligomer.

64. The method of claim 63 wherein the epoxy acrylate oligomer is derived from having the formula:

$$R^1-[-CH_2-CHOH-CH_2-O(O)C-CH=CH_2]_n$$

wherein $R^1$ is an aliphatic, aromatic or arene moiety having at least two carbon atoms and at least two oxido residues, and n is an integer of from 2 to about 6.

65. The method of claim 64 wherein $R^1$ is a bisphenol residue.

66. The method of claim 62 wherein the epoxy oligomer is thixotropic.

67. The method of claim 62 wherein the epoxy oligomer is obtained by reacting a diepoxide with an acid component having an ethylenically unsaturated carboxylic acid or reactive derivative thereof in the presence of a polyamide derived from a polymerized fatty acid.

68. The method of claim 67 wherein the acid component is acrylic acid.

69. The method of claim 68 wherein the diepoxide is a diglycidyl ether of a dihydric phenol.

70. The method of claim 62 wherein the alkoxylated polyol monomer has the formula:

$$R^2-[-(Y)_x-R^3-CH=CH-R^4]_n$$

wherein $R^1$ is an aliphatic, aromatic, or arene moiety having at least two carbon atoms and at least two oxido residues, Y is an alkylene oxide moiety and x is an integer of from 2 to about 6, $R^3$ is a linkage group which joins the alkylene oxide moiety Y and the —CH=CH— group, $R^4$ is hydrogen or —C(O)OR$^5$ wherein $R^5$ is hydrogen or an alkyl group having from 1 to about 22 carbon atoms, and n is an integer of from 2 to about 6.

71. The method of claim 70 wherein the at least one alkoxylated polyol monomer comprises a mixture of at least one alkoxylated polyol diacrylate and at least one alkoxylated polyol triacrylate.

72. The method of claim 62 wherein the sugar surfactant is a polyhydroxy fatty acid amide corresponding to formula I:

(I)

wherein $R^1$ is H, $C_1$–$C_4$ hydrocarbyl, 2-hydroxy ethyl, 2-hydroxy propyl, or a mixture thereof; and $R_2$ is a $C_5$–$C_{31}$ hydrocarbyl moiety; and Y is a polyhydroxyhydrocarbyl moiety having a linear hydrocarbyl chain with at least 3 hydroxyls directly connected to the chain, or an alkoxylated derivative thereof.

73. The method of claim 62 wherein the sugar surfactant is an alkyl polyglycoside corresponding to formula II:

$$R_1O(R_2O)_b(Z)_a \qquad \text{II}$$

wherein $R_1$ is a monovalent organic radical having from about 6 to about 30 carbon atoms; $R_2$ is divalent alkylene radical having from 2 to 4 carbon atoms; Z is a saccharide residue having 5 or 6 carbon atoms; b is a number having a value from 0 to about 12; a is a number having a value from 1 to about 6.

74. The method of claim 73 wherein in formula II, $R_1$ is a monovalent organic radical having from about 8 to about 16 carbon atoms, b is zero, and a is a number having a value of from about 1 to about 2.

75. The method of claim 62 wherein the polymer-forming composition further includes a photoinitiator.

76. The method of claim 62 wherein the polymer-forming composition further includes a colorant.

77. The method of claim 62 wherein the step of employing the applicator means for applying the polymer-forming composition comprises a method selected from the group consisting of dipping, brushing, spraying and rolling.

78. The method of claim 62 wherein the substrate is a porous screen.

79. The method of claim 78 further including the step of engraving the blank stencil to form a printing mask.

80. The method of claim 79 wherein said engraving step is performed by means of a laser.

81. The method of claim 62 wherein the source of energy includes electron beam radiation.

82. The method of claim 62 wherein the source of energy includes UV radiation.

83. The method of claim 82 wherein the source of UV radiation provides a UV radiation energy density of from about 2000 to about 3000 mJ/cm$^2$.

84. The method of claim 62 wherein the substrate is metal.

85. The method of claim 62 wherein the substrate is a textile.

* * * * *